(12) United States Patent
Ishida et al.

(10) Patent No.: US 7,631,997 B2
(45) Date of Patent: Dec. 15, 2009

(54) VEHICULAR HEADLAMP AND LIGHT EMISSION MODULE

(75) Inventors: Hiroyuki Ishida, Shizuoka (JP); Masashi Tatsukawa, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 210 days.

(21) Appl. No.: 11/825,745

(22) Filed: Jul. 9, 2007

(65) Prior Publication Data

US 2007/0258259 A1 Nov. 8, 2007

Related U.S. Application Data

(63) Continuation-in-part of application No. 10/769,056, filed on Jan. 30, 2004, now Pat. No. 7,255,467.

(30) Foreign Application Priority Data

Feb. 6, 2003 (JP) ............................... 2003-029485

(51) Int. Cl.
*F21V 5/04* (2006.01)
*F21V 21/00* (2006.01)
(52) U.S. Cl. ........................ 362/520; 362/521; 362/522; 362/545
(58) Field of Classification Search ................. 362/520, 362/545, 509, 521, 522, 539, 800, 543, 544, 362/511, 514, 516
See application file for complete search history.

(56) References Cited

U.S. PATENT DOCUMENTS

| 1,598,044 | A | * | 8/1926 | Bone | ........................... | 362/308 |
| 2,760,051 | A | * | 8/1956 | Schmidt | ..................... | 362/530 |
| 5,081,564 | A | * | 1/1992 | Mizoguchi et al. | .......... | 362/521 |
| 6,945,672 | B2 | * | 9/2005 | Du et al. | ..................... | 362/241 |
| 7,019,334 | B2 | | 3/2006 | Yatsuda et al. | | |

(Continued)

FOREIGN PATENT DOCUMENTS

EP 1447616 8/2004

(Continued)

OTHER PUBLICATIONS

French Search Report for French Patent Application No. 0401096, mailed Jan. 29, 2008, 3 pages.

(Continued)

*Primary Examiner*—Bao Q Truong
(74) *Attorney, Agent, or Firm*—Osha • Liang LLP

(57) ABSTRACT

A vehicular headlamp includes a semiconductor light emitting device that faces in a direction substantially perpendicular to a forward direction, a reflector that is formed like a curved surface so as to surround the semiconductor light emitting device, has an opening at its front, has its optical center on the semiconductor light emitting device, and reflects forward light generated by the semiconductor light emitting device, and a light transmitting member that is formed so as to cover the semiconductor light emitting device. Here, the light transmitting member includes a cover member that covers the semiconductor light emitting device and transmits at least apart of the light generated by the semiconductor light emitting device, and a deflection member that covers front of the semiconductor light emitting device and deflects forward a part of the light generated by the semiconductor light emitting device.

7 Claims, 13 Drawing Sheets

U.S. PATENT DOCUMENTS

| | | |
|---|---|---|
| 7,128,453 B2 | 10/2006 | Tatsukawa et al. |
| 7,312,477 B2 | 12/2007 | Yatsuda et al. |
| 2001/0019486 A1 | 9/2001 | Thominet |
| 2004/0160783 A1 | 8/2004 | Tatsukawa et al. |
| 2004/0251469 A1 | 12/2004 | Yatsuda et al. |
| 2006/0071222 A1 | 4/2006 | Yatsuda et al. |

FOREIGN PATENT DOCUMENTS

| | | |
|---|---|---|
| EP | 1487025 | 12/2004 |
| JP | 57-197657 | 12/1982 |
| JP | 11-154766 | 6/1999 |
| JP | 2000-348508 | 12/2000 |
| JP | 2002-94129 | 3/2002 |
| JP | 2002-336275 | 11/2002 |
| JP | 2003-31011 | 1/2003 |
| JP | 200331007 | 1/2003 |
| WO | WO 2004007241 | 1/2004 |

OTHER PUBLICATIONS

Patent Abstracts of Japan, Publication No. 2002-094129, Publication Date: Mar. 29, 2002, 2 pages.

Japanese Office Action for Japanese patent application No. 2003-029485, issued on Aug. 28, 2007, and English translation thereof 4 pages.

* cited by examiner

VEHICULAR HEADLAMP AND LIGHT EMISSION MODULE

CROSS REFERENCE TO RELATED APPLICATION

This is a continuation in-part application of Ser. No. 10/769,056 filed on Jan. 30, 2004 which claims priority from a Japanese Patent Application No. 2003-29485 filed on Feb. 6, 2003, the contents of which are incorporated herein by reference.

BACKGROUND

1. Technical Field

The present invention relates to a vehicular headlamp and a light emission module. More particularly, the present invention relates to a vehicular headlamp for emitting light ahead of an automobile.

2. Related Art

A light emitting diode module has been conventionally known that improves efficiency in the use of light by using a reflecting mirror as disclosed, for example, in Japanese Patent Application Publication (Laid-Open) No. 2002-94129 (pages 4-31 and FIGS. 3-146). In this light emitting diode module, light emitted by a light emitting device is reflected by a concave mirror provided on a back face of mold resin.

SUMMARY

The vehicular headlamp including, for example, regular headlamp, fog lamp and cornering lamp for automobiles, trains, motorcycles or the like, should form a light distribution pattern with high precision from safety reasons. Therefore, it is necessary to control the light emitted by the light emitting device with high precision. However, when sufficient consideration of the light distribution pattern to be formed was not made, the efficient use of the light became difficult in some cases.

Therefore, it is an object of the present invention to provide a vehicular headlamp and a light emission module, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a vehicular headlamp includes a semiconductor light emitting device that faces in a direction substantially perpendicular to a forward direction, a reflector that is formed like a curved surface so as to surround the semiconductor light emitting device, has an opening at its front, has its optical center on the semiconductor light emitting device, and reflects forward light generated by the semiconductor light emitting device, and a light transmitting member that is formed so as to cover the semiconductor light emitting device. Here, the light transmitting member includes a cover member that covers the semiconductor light emitting device and transmits at least a part of the light generated by the semiconductor light emitting device, and a deflection member that covers front of the semiconductor light emitting device and deflects forward a part of the light generated by the semiconductor light emitting device.

The cover member may have a shape like a spherical shell having a substantially constant thickness, and having its center around the semiconductor light emitting device.

An inert gas may be enclosed in a space between the cover member and the semiconductor light emitting device. A space between the cover member and the semiconductor light emitting device may be substantially a vacuum.

The deflection member may be positioned in such a manner that a position of its focus coincides with the semiconductor light emitting device.

According to the second aspect of the present invention, a vehicular headlamp includes a semiconductor light emitting device that faces in a direction substantially perpendicular to a forward direction, a reflector that is formed like a curved surface so as to surround the semiconductor light emitting device, has an opening at its front, has its optical center on the semiconductor light emitting device, and reflects forward light generated by the semiconductor light emitting device, and a light transmitting member that is formed so as to cover the semiconductor light emitting device. Here, the light transmitting member includes a deflection member that covers front of the semiconductor light emitting device and deflects forward a part of the light generated by the semiconductor light emitting device, and light emitted in a forward direction by the semiconductor light emitting device directly reaches the deflection member.

The deflection member may be positioned in such a manner that a position of its focus coincides with the semiconductor light emitting device.

According to the third aspect of the present invention, a light emission module for generating light used in a vehicular headlamp includes a semiconductor light emitting device, a cover member that covers the semiconductor light emitting device, and makes at least a part of light generated by the semiconductor light emitting device transmit therethrough straight, and a deflection member that covers front of the semiconductor light emitting device, and deflects forward a part of the light generated by the semiconductor light emitting device.

According to the fourth aspect of the present invention, a light emission module for generating light used in a vehicular headlamp includes a semiconductor light emitting device, and a deflection member that covers front of the semiconductor light emitting device, and deflects forward a part of light generated by the semiconductor light emitting device. Here, light emitted in a forward direction by the semiconductor light emitting device directly reaches the deflection member.

Here, all the necessary features of the present invention are not listed in the summary. The sub-combinations of the features may become the invention.

DESCRIPTION OF EXEMPLARY EMBODIMENTS

Hereinafter, an advantage of some embodiments of the present invention will be described. The embodiments do not limit the invention according to the claims, and all the combinations of the features described in the embodiments are not necessarily essential to means provided by aspects of the invention.

Figure 1:
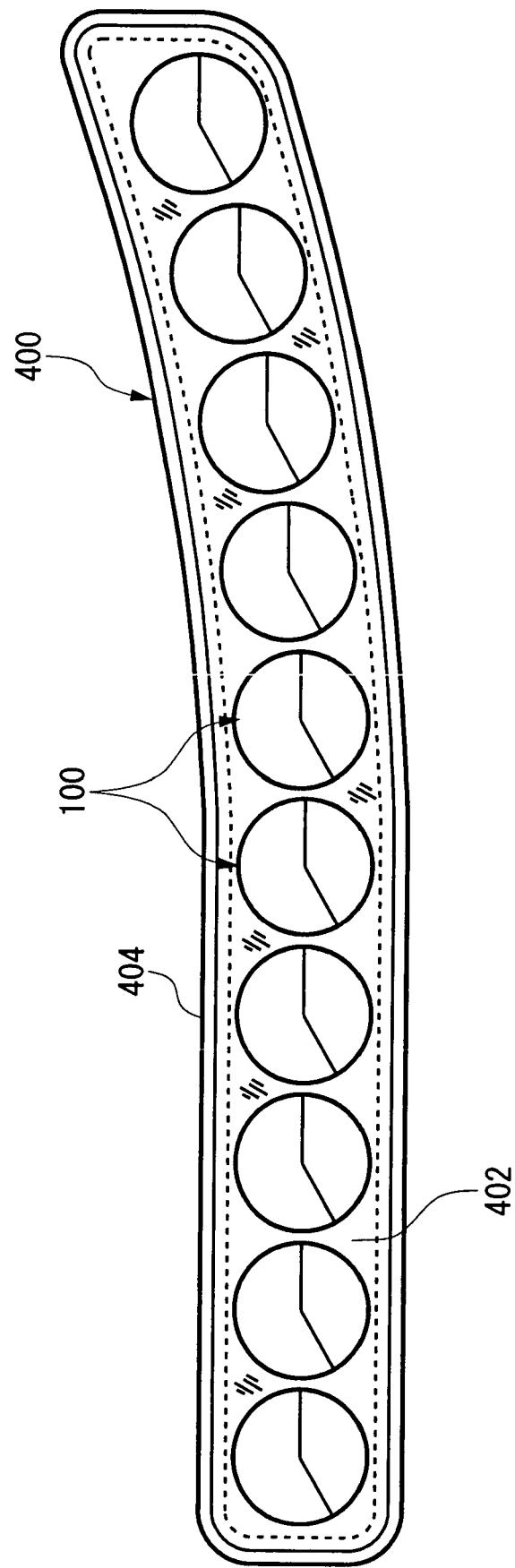
FIG. 1 illustrates an exemplary structure of a vehicular headlamp 400 according an embodiment of the present invention.

FIG. 1 illustrates an exemplary structure of a vehicular headlamp 400 according to an embodiment of the present invention. The vehicular headlamp 400 of this example aims to use light generated by a light source with high efficiency. The vehicular headlamp 400 is a vehicular headlamp for emitting a low beam and accommodates a plurality of light source units 100 arranged in a substantially horizontal line within a lamp chamber formed by a transparent cover 402 and a lamp body 404.

The light source units 100 have the same or similar structure and are accommodated in the lamp chamber in such a manner that their optical axes are at a downward angle of about 0.3 to about 0.6 degrees with respect to a longitudinal direction of an automobile when the vehicular headlamp 400 is mounted on the body of the automobile.

The vehicular headlamp 400 emits light ahead of the automobile based on the light emitted by those light source units 100, so as to form a predetermined light distribution pattern. The vehicular headlamp 400 may include a plurality of light source units 100 each having different light distribution characteristics. Alternatively, the vehicular headlamp 400 may include a single light source unit 100 to form a light distribution pattern based on the light emitted by this single light source unit 100.

Figure 2:
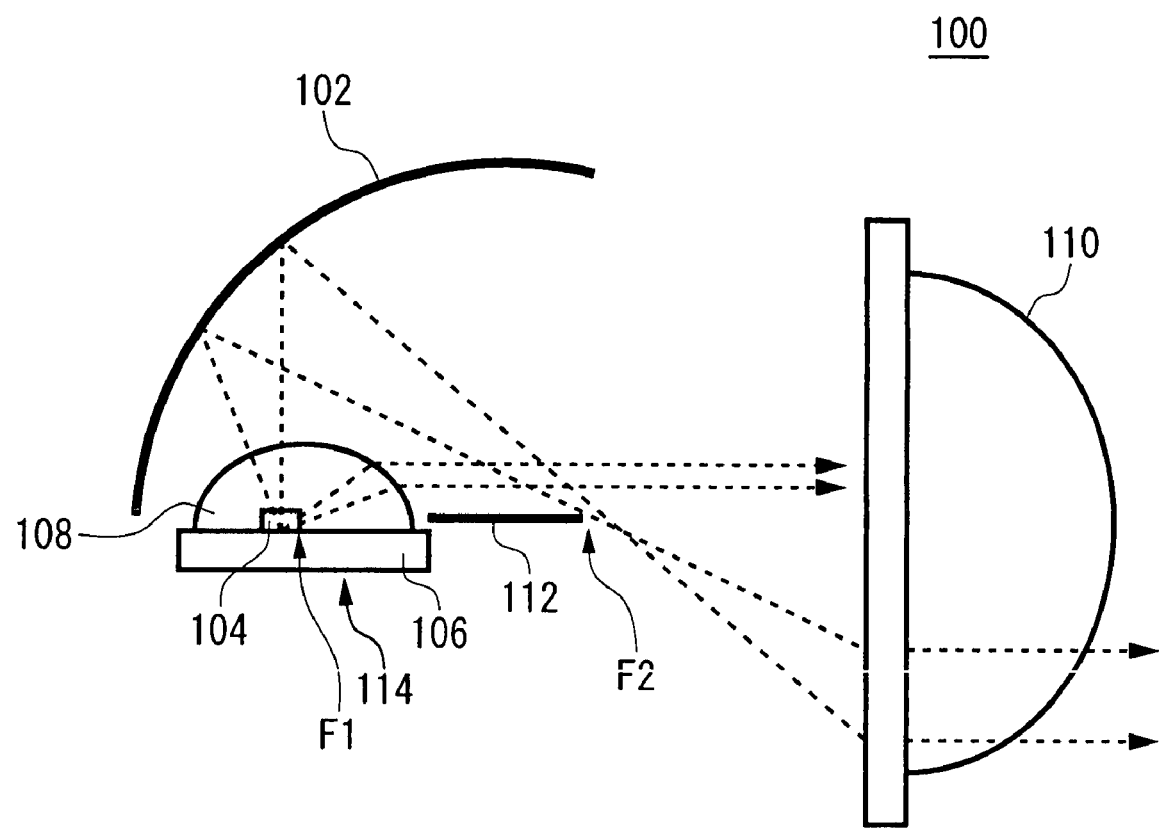
FIG. 2 illustrates an exemplary structure of a light source unit 100.

FIG. 2 illustrates an exemplary structure of the light source unit 100. The light source unit 100 of this example is a projector-type light source unit that emits light that was reflected and converged at a position near the optical axis, forward via a lens. The light source unit 100 includes a light source 114, a reflector 102, a light blocking member 112 and a lens 110.

The light source 114 is an example of a light emission module that generates light used in the vehicular headlamp 400 (see FIG. 1). In this example, the light source 114 is a light emitting diode module that generates white light and includes a semiconductor light emitting device 104, a substrate 106 and a light transmitting member 108.

In this example, the semiconductor light emitting device 104 is a light emitting diode device (LED) that generates blue light, and makes the blue light incident on phosphors (not shown) provided between the semiconductor light emitting device 104 and the light transmitting member 108, thereby causing the phosphors to generate yellow light that is light of complementary color of blue. In this manner, the semiconductor light emitting device 104 generates white light.

In an alternative example, the semiconductor light emitting device 104 may cause the phosphors to generate white light by irradiating the phosphors with ultraviolet light. In this manner, the semiconductor light emitting device 104 can generate white light, too.

The substrate 106 is a plate-like component which fixes the semiconductor light emitting device 104 placed on its upper face. The light transmitting member 108 is a mold formed from material that can transmit white light generated by the semiconductor light emitting device 104 so as to cover the semiconductor light emitting device 104. The light transmitting member 108 is formed to seal the semiconductor light emitting device 104 from above in such a manner that the light transmitting member 108 is opposed to the substrate 106 with the semiconductor light emitting device 104 sandwiched therebetween.

In this example, the light transmitting member 108 has a shape in which a part to be positioned close to the front of the automobile is flatter than a part to be positioned close to the rear part of the automobile. Due to such a shape, the light transmitting member 108 can deflect forward substantially all of light generated upward in the forward direction by the semiconductor light emitting device 104, thereby making that light incident on the lens 110. In this case, the light transmitting member 108 may deflect at least a part of the light emitted in the forward direction by the semiconductor light emitting device 104, in a direction toward the front of the automobile, i.e., a substantially horizontal direction.

The light transmitting member 108 transmits substantially all of light generated upward in the backward direction by the semiconductor light emitting device 104 toward the reflector 102 by, for example, transmitting that light straight. Thus, the light transmitting member 108 can make at least most of the light generated by the semiconductor light emitting device 104 incident on the lens 110 or reflector 102 at an appropriate incident angle.

The reflector 102 is a combined elliptical reflecting mirror provided to extend over the light source 114 from behind toward a position above and anterior to the light source 114, and is formed to approximately surround the light source from behind, from above and from the sides of the light source 114. In this manner, the reflector 102 reflects forward approximately all of light emitted by the semiconductor light emitting device 104 toward the reflector 102, thereby making the reflected light incident on the lens 110. The reflector 102 may be formed to cover the light transmitting member 108 from the back of the semiconductor light emitting device 104.

At least a part of the reflector 102 has focal points F1 and F2 of an elliptical surface in a horizontal plane substantially containing the semiconductor light emitting device 104. In this example, this part of the reflector 102 has the focal point F1 on the semiconductor light emitting device 104 and the focal point F2 in the vicinity of the front edge of the light blocking member 112. Therefore, the reflector 102 converges the reflected light at a position in the vicinity of the front edge of the light blocking member 112. Please note that the focal points F1 and F2 are an example of an optical center that is a focal point, a reference point in optical design or the like. Moreover, in accordance with precision required for forming a cut line, that part of the reflector 102 may have the focal point F1 in a predetermined region on the semiconductor light emitting device 104 that corresponds to the required precision.

The light blocking member 112 is a plate-like component provided between the semiconductor light emitting device 104 and the lens 110 in the horizontal plane substantially containing the semiconductor light emitting device 104, and blocks a part of light generated by the semiconductor light emitting device 104 at the front edge thereof. In this example, the upper face of the light blocking member 112 is formed by a reflecting mirror. In this case, the light blocking member 112 blocks the light incident thereon by reflecting it. The light blocking member 112 may allow the reflected light to be incident on the lens 110. Thus, it is possible to use the light generated by the semiconductor light emitting device 104 with high efficiency.

The lens 110 is a lens made of resin such as polyether sulfone (PES), and forms at least a part of the light distribution pattern of the vehicular headlamp 400 by directing the light generated by the semiconductor light emitting device 104 ahead of the automobile. In this example, the lens 110 has its focal point in the vicinity of the front edge of the light blocking member 112 and directs the light substantially converged in the vicinity of the front edge of the light blocking member 112 by the reflector 102, ahead of the automobile as substantially collimated light. In this manner, the lens 110 forms at least a part of a cut line that defines a boundary between a bright region and a dark region in the light distribution pattern based on the shape of the front edge of the light blocking member 112.

Here, a case is considered where a part of the light generated by the semiconductor light emitting device 104 passes between the reflector 102 and the lens 110. In this case, this light is not incident on either the reflector 102 or the lens 110. Therefore, this light makes no contribution to the light distribution by the light source unit 100. Thus, the light is not used efficiently.

However, according to this example, at least most of the light generated by the semiconductor light emitting device 104 is incident on the reflector 102 or lens 110 at an appropriate incident angle. Therefore, it is possible to use the light generated by the semiconductor light emitting device 104 with high efficiency.

Moreover, if the direction of the light generated by the semiconductor light emitting device 104 were controlled by using mold, for example, sufficient precision could not be obtained when the direction of the light that passed through the mold was not appropriate. Therefore, that light could not be used for forming the light distribution pattern of the vehicular headlamp. However, in this example, the light transmitting member 108, the light blocking member 112, and the lens 110 are formed appropriately with respect to the position of the semiconductor light emitting device 104 in order to form the light distribution pattern. Therefore, according to this example, it is possible to appropriately use the light generated by the semiconductor light emitting device 104 with high efficiency so as to form an appropriate light distribution pattern.

Figure 3:
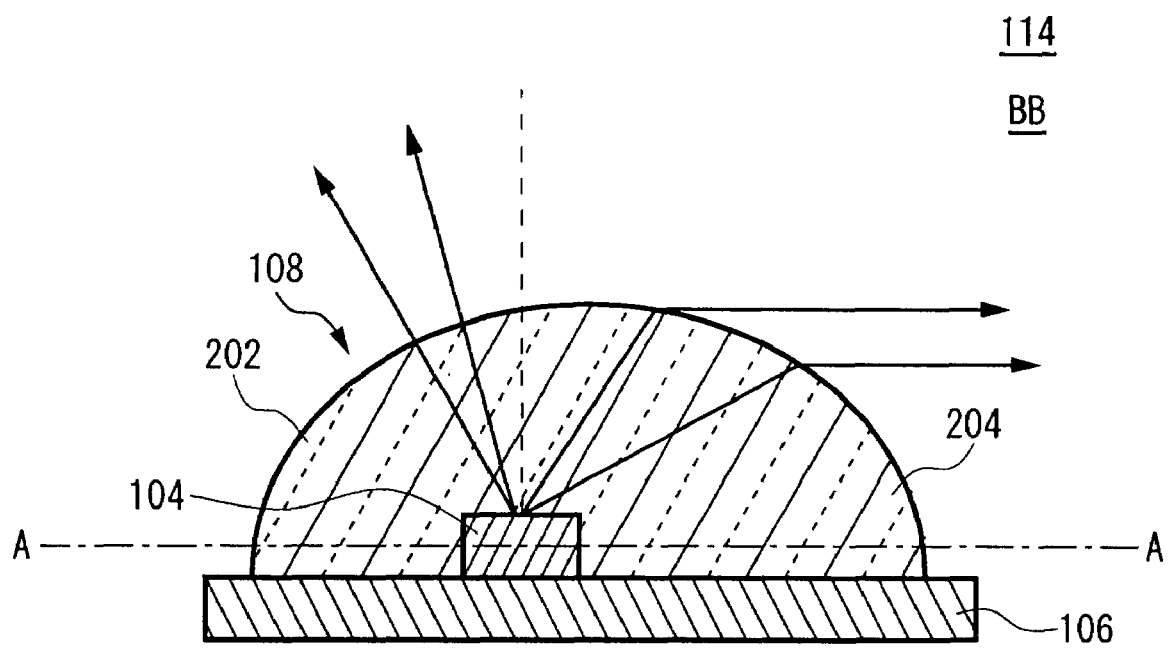
FIG. 3 shows a BB vertical cross section of a light source 114.
Figure 4:
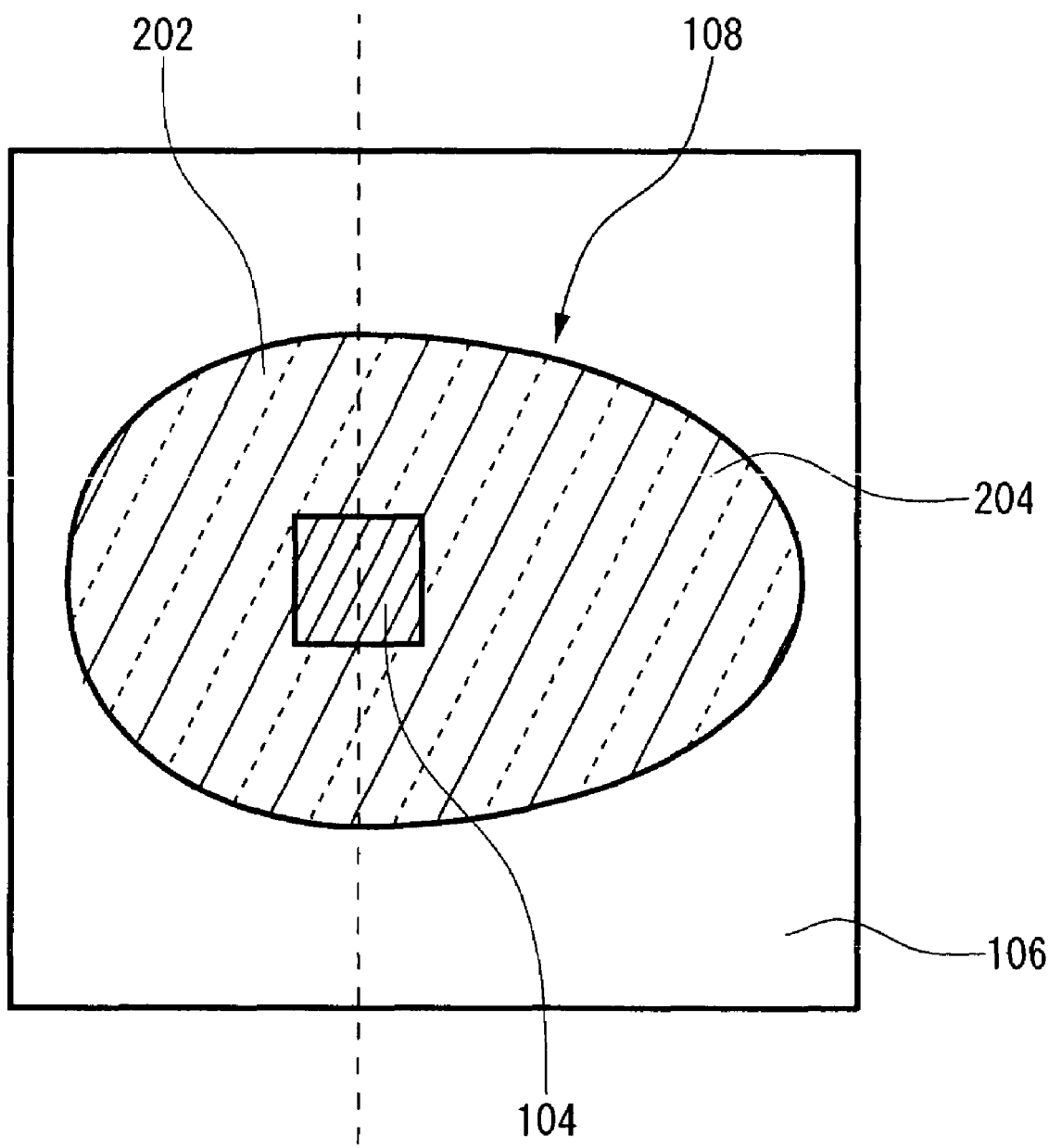
FIG. 4 shows an AA horizontal cross section of the light source 114.

FIGS. 3 and 4 show details of the structure of the light source 114. FIG. 3 shows a BB vertical cross section of the light source 114, while FIG. 4 shows an AA horizontal cross section thereof.

In this example, the light transmitting member 108 includes a rear sealing part 202 and a front sealing part 204 that correspond to two parts of the light transmitting member 108, respectively. The rear sealing part 202 has a shape like a quarter sphere having a focal point thereof in proximity of the semiconductor light emitting device 104, and seals a rear side of the semiconductor light emitting device 104. Thus, the rear sealing part 202 transmits the light generated by the semiconductor light emitting device 104 upward in the rearward direction, substantially straight.

The front sealing part 204 has a more flattened shape than the rear sealing part 202. The front sealing part 204 is formed integrally with the rear sealing part 202, thereby sealing a front side of the semiconductor light emitting device 104. Thus, the front sealing part 204 deflects further forward the light generated upward in the frontward direction by the semiconductor light emitting device 104. The front sealing part 204 has a shape in which a radius of curvature of a surface in the cross section parallel to the direction in which the vehicular headlamp 400 (see FIG. 1) emits light is smaller than that of the surface of the rear sealing part 202, for example. According to this example, it is possible to use the light generated by the semiconductor light emitting device 104 with high efficiency in the light source unit 100 (see FIG. 2).

Figure 5:
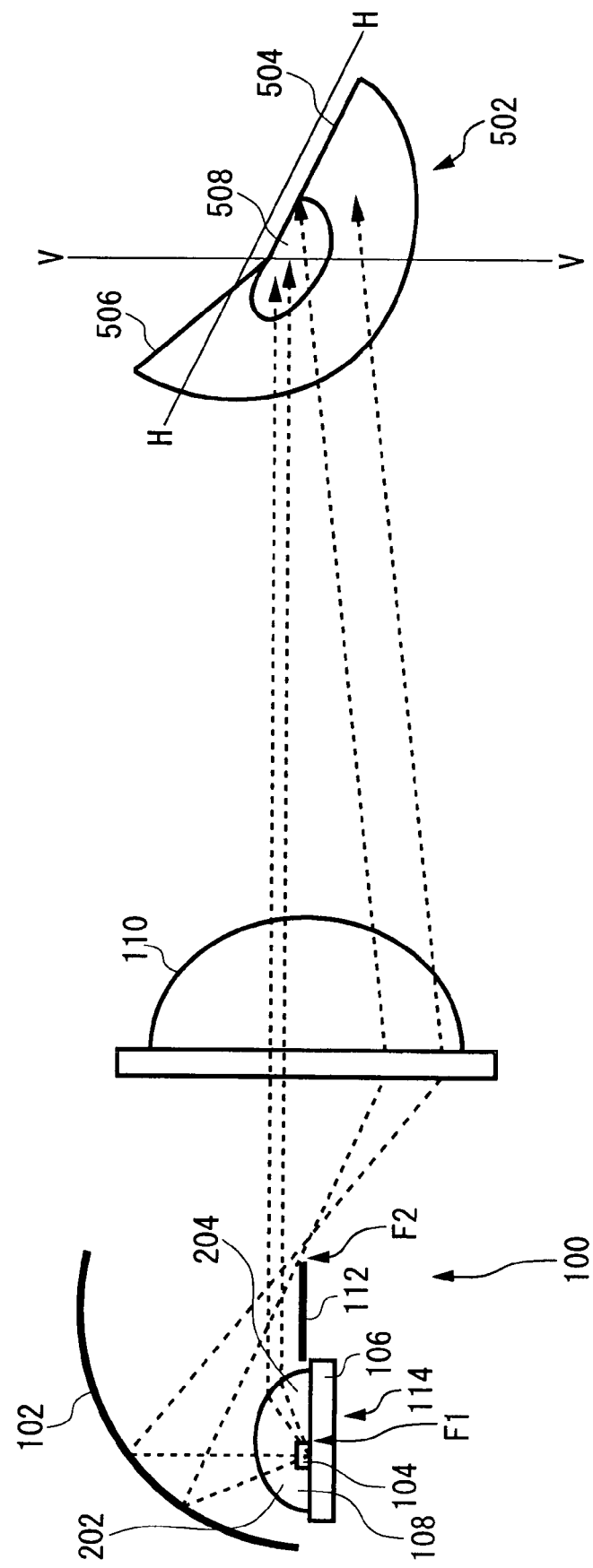
FIG. 5 is a conceptual diagram of an exemplary light distribution pattern 502.

FIG. 5 is a conceptual diagram showing an exemplary light distribution pattern 502 formed by the light source unit 100. The light distribution pattern 502 is a low-beam light distribution pattern formed on a virtual vertical screen arranged at a position 25 meters ahead of the light source unit 100.

The reflector 102 forms a boundary between a bright region and a dark region based on the shape of the front edge of the light blocking member 112 by focusing the light at the focal point F2 in the vicinity of the front edge of the light blocking member 112. The lens 110 then casts forward the light focused in the vicinity of the front edge of the light blocking member 112, so as to form a horizontal cut line 504 and a diagonal cut line 506 that define a boundary between bright and dark regions in the light distribution pattern 502 based on the boundary between the bright and dark regions formed in the vicinity of the front edge of the light blocking member 112.

The front edge of the light blocking member 112 may have a shape in which both ends are turned down seen from the front, for example to correspond to the horizontal cut line 504 and the diagonal cut line 506. Moreover, the lens 110 may direct the light reflected to a position away from the focal point F2 by the reflector 102, toward a region other than the horizontal cut line 504 and the diagonal cut line 506 in the light distribution pattern 502 as diffused light, for example.

In this example, the light transmitting member 108 deflects forward a part of the light generated by the semiconductor light emitting device 104, thereby making the part of the light pass in the vicinity of the position of the focus of the lens 110 so as to make the part of the light incident directly on the lens 110. In this case, the lens 110 directs this incident light to a region 508 directly below an intersection of the horizontal cut line 504 and the diagonal cut line 506, the region 508 being in the center region of the light distribution pattern 502. Thus, the light source unit 100 clearly forms the horizontal cut line 504 and the diagonal cut line 506 in the center region (hot zone) of the light distribution pattern 502. Therefore, according to this example, it is possible to efficiently use the light generated by the semiconductor light emitting device 104 so as to form an appropriate light distribution pattern 502.

Figure 6:
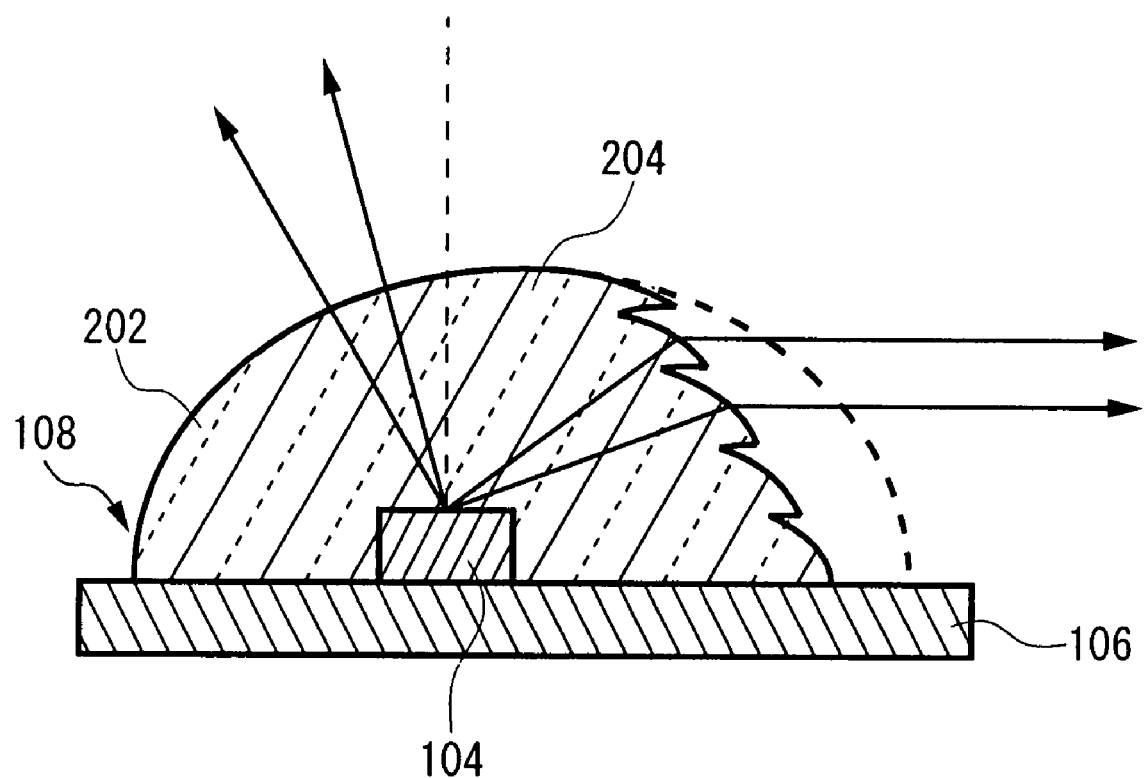
FIG. 6 shows a vertical cross section of another exemplary light source 114.

FIG. 6 is a vertical cross-sectional view of another exemplary light source 114. In this example, the front face of the front sealing part 204 is formed like a Fresnel lens. In this case, the size of the front sealing part 204 can be reduced as compared with that of the front sealing part 204 that was described referring to FIG. 3 and is shown with broken line in FIG. 6. Moreover, in this case, the size of the light source 114 can be reduced. Except for the above, the components shown in FIG. 6 having the same reference numerals as those in FIG. 3 have the same or similar functions as/to those of the components shown in FIG. 3 and therefore the description thereof is omitted.

Figure 7:
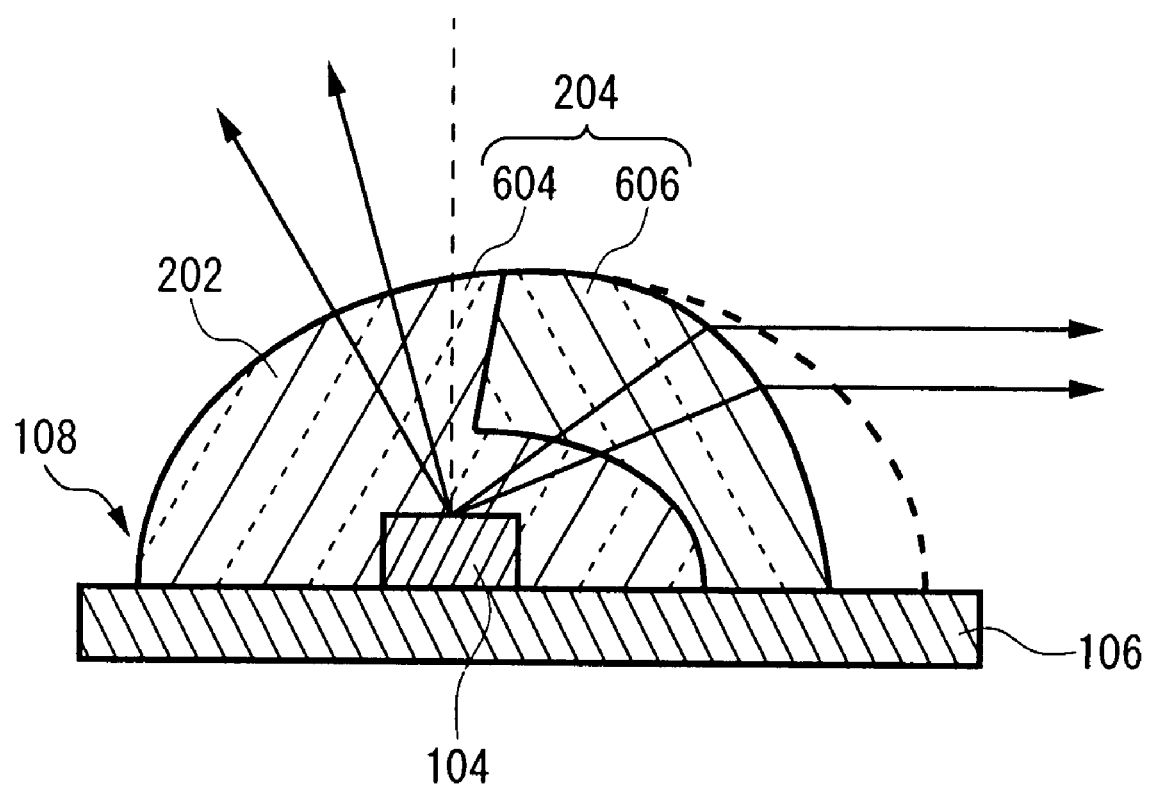
FIG. 7 shows a vertical cross section of still another exemplary light source 114.

FIG. 7 shows a vertical cross section of still another exemplary light source 114. In this example, the front sealing part 204 includes the first member 604 and the second member 606. The first member 604 is formed integrally with the rear sealing part 202 from the same material as that of the rear sealing part 202 and seals the semiconductor light emitting device 104 from the front of the semiconductor light emitting device 104. The second member 606 is formed from material having higher refractive index than that of the first member 604 so as to cover the first member 604 from the front side of the first member 604. Thus, the second member 606 deflects forward light that is incident from the semiconductor light emitting device 104 via the first member 604.

In this example, a part of the front sealing part 204 is formed from material having higher refractive index than that of the rear sealing part 202. In this case, the surface of the front sealing part 204 can be formed to have a larger radius of curvature than that of the front sealing part 204 described referring to FIG. 3. Therefore, also in this example, the size of the front sealing part 204 can be reduced.

Except for the above, the components shown in FIG. 7 having the same reference numerals as those in FIG. 3 have the same or similar functions as/to those of the components in FIG. 3 and therefore the description thereof is omitted. In still another example, the front sealing part 204 may be entirely formed from material having higher refractive index than that of the rear sealing part 202.

Figure 8:
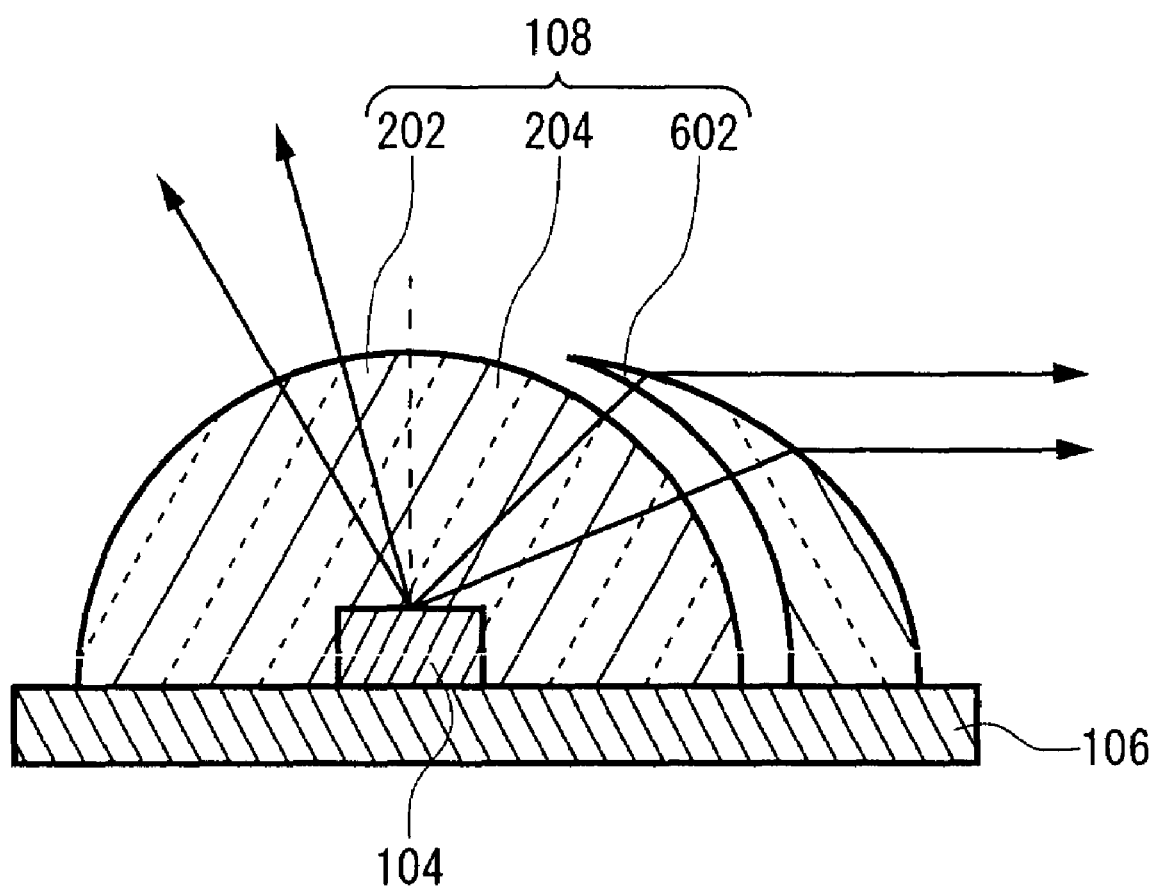
FIG. 8 shows a vertical cross section of still another exemplary light source 114.

FIG. 8 shows a vertical cross section of still another exemplary light source 114. In this example, the light transmitting member 108 further includes a deflection member 602. Moreover, the rear sealing part 202 and the front sealing part 204 are formed integrally with each other to have an approximately hemispherical shape. In this case, the front sealing part 204 may have an approximately quarter-spherical shape.

The deflection member 602 is formed from material that can transmit light generated by the semiconductor light emitting device 104, that is the same material as the front sealing part 204, for example, so as to cover the front of the front sealing part 204. Moreover, the radius of curvature of the front face of the deflection member 602 is smaller than that of the front face of the front sealing part 204. Thus, the deflection member 602 deflects forward light incident via the front sealing part 204 from the semiconductor light emitting device 104. Also in this case, it is possible to use the light generated by the semiconductor light emitting device 104 with high efficiency in the light source unit (see FIG. 2). Moreover, according to this example, the light source 114 can be simply formed by adding the deflection member 602 to a general-purpose light emitting diode module having a hemispherical mold, for example.

The deflection member 602 may be formed from material having higher refractive index than that of the front sealing part 204. In this case, the size of the deflection member 602 can be reduced. Moreover, the deflection member 602 may be provided to be away from the front sealing part 204 or be in contact at its rear face with the front face of the front sealing part 204. Except for the above, the components shown in FIG. 8 having the same reference numerals as those in FIG. 3 have the same or similar functions as/to those of the components in FIG. 3 and therefore the description thereof is omitted.

Figure 9:
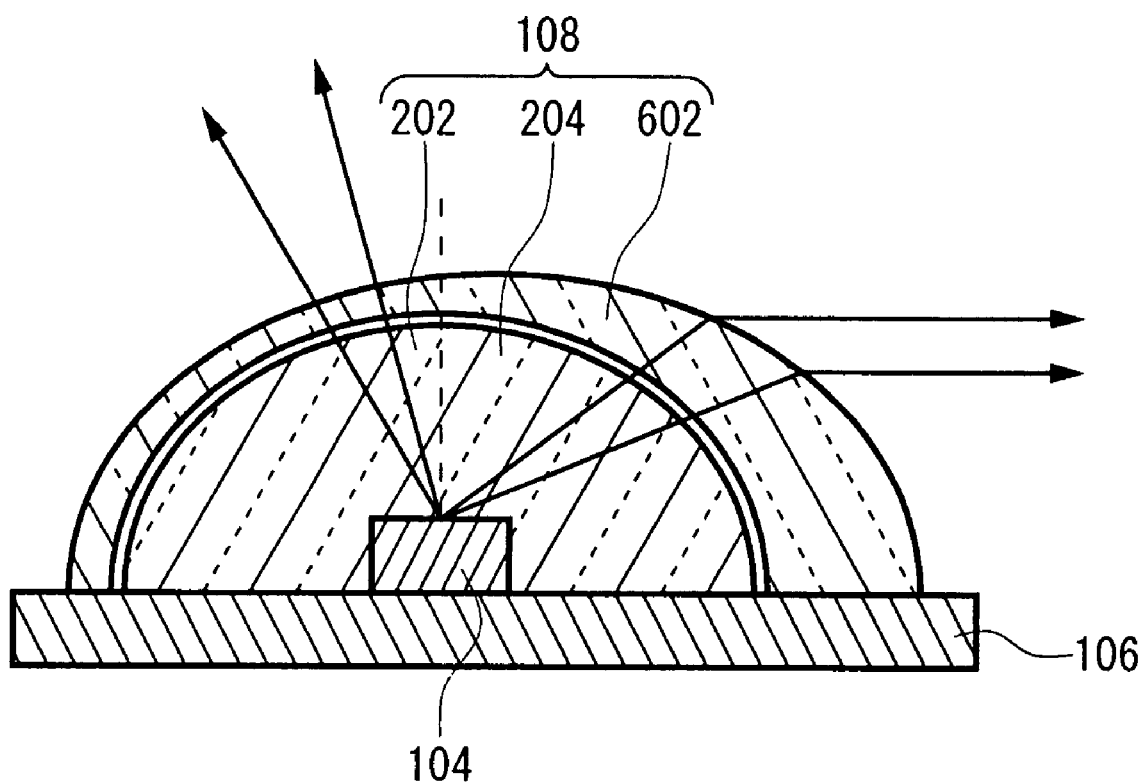
FIG. 9 shows a vertical cross section of still another exemplary light source 114.

FIG. 9 shows a vertical cross section of still another exemplary light source 114. In this example, the deflection member 602 is formed to cover the upper faces and the side faces of the rear and front sealing parts 202 and 204. A part of the deflection member 602 to be positioned close to the rear of the automobile may have a shape like a spherical shell having a substantially constant thickness. A part of the deflection member 602 to be positioned close to the front of the automobile may have a shape in which the thickness gradually increases toward the front.

Due to the above structure, the deflection member 602 allows light incident from the semiconductor light emitting device 104 via the rear sealing part 202 to pass therethrough straight. Moreover, the deflection member 602 deflects forward light incident from the semiconductor light emitting device 104 via the front sealing part 204. According to this example, it is also possible to simply form the light source 114. Except for the above, the components shown in FIG. 9 having the same reference numerals in FIG. 8 have the same or similar functions as/to those of the components in FIG. 8 and therefore the description thereof is omitted.

Figure 13:
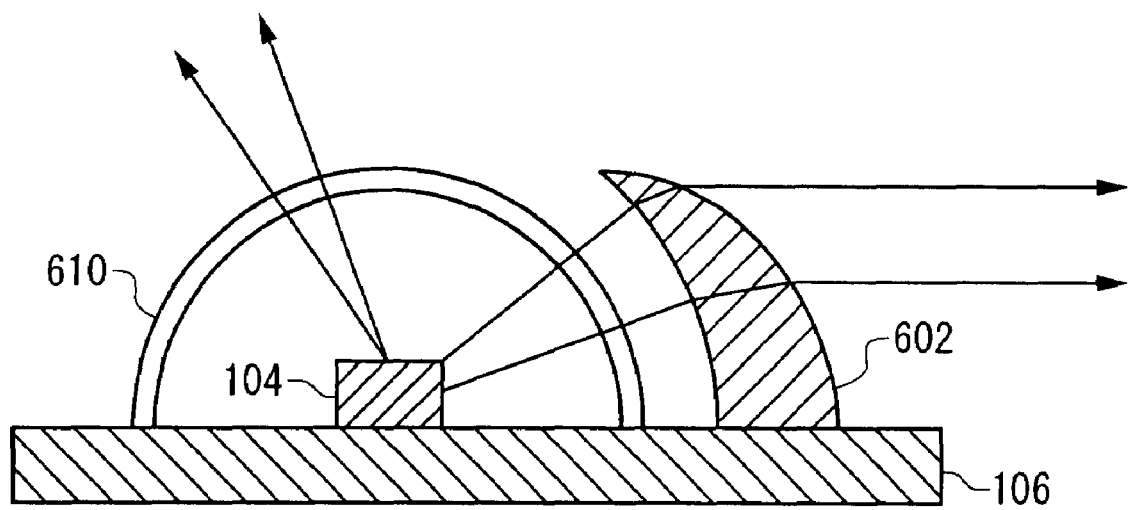
FIG. 13 shows a vertical cross section of still another exemplary light source 114.

FIG. 13 shows a vertical cross section of still another exemplary light source 114. In this example, the light transmitting member 108 includes a cover 610 and the deflection member 602. The cover 610 is formed from material that can transmit light generated by the semiconductor light emitting device 104 so as to cover the semiconductor light emitting device 104. The cover 610 may have a shape like a spherical shell having a substantially constant thickness, and have its center around the semiconductor light emitting device 104. Having the above configurations, the cover 610 makes the light generated by the semiconductor light emitting device 104 pass substantially straight. In the space within the cover 610, an inert gas may be enclosed. The pressure in the space within the cover 610 may be reduced, or substantially vacuum.

The deflection member 602 is formed from material that can transmit light generated by the semiconductor light emitting device 104, so as to cover the front of the cover 610. The deflection member 602 deflects forward light incident via the cover 610 from the semiconductor light emitting device 104. The deflection member 602 is preferably positioned in such a manner that the position of the focus of the deflection member 602 coincides with the semiconductor light emitting device 104. The deflection member 602 may have a similar shape to the deflection member 602 shown in FIG. 9. The deflection member 602 may be provided on the light blocking member 112.

Also in this case, it is possible to use the light generated by the semiconductor light emitting device 104 with high efficiency in the light source unit 100 (see FIG. 2). Moreover, according to this example, the light source 114 can be simply formed by adding the deflection member 602 to a general-purpose light emitting diode module having a cover, for example. Except for the above, the components shown in FIG. 13 having the same reference numerals as those in FIGS. 3 and 8 have the same or similar functions as/to those of the components in FIGS. 3 and 8 and therefore the description thereof is omitted.

Figure 14:
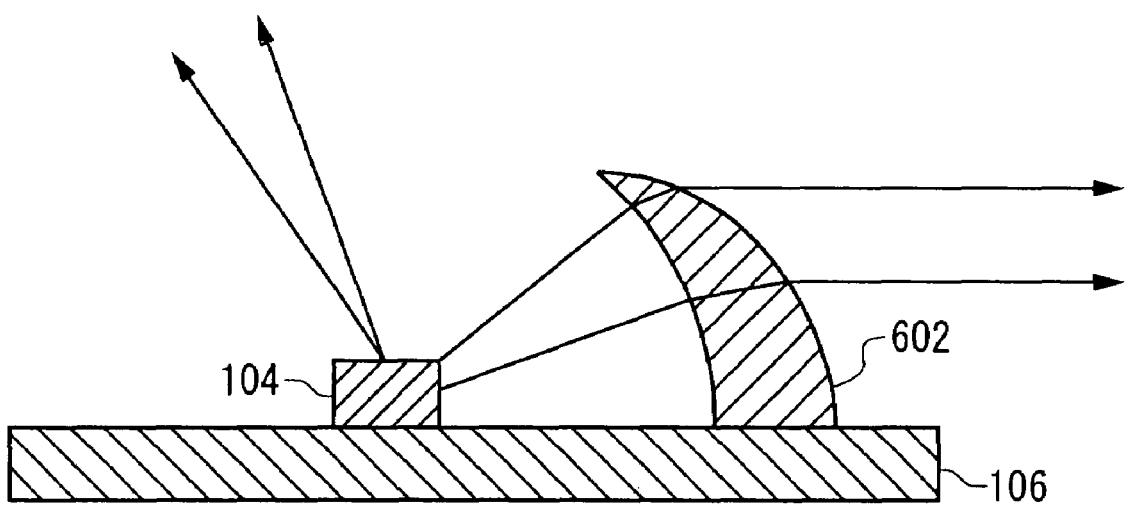
FIG. 14 shows a vertical cross section of still another exemplary light source 114.

FIG. 14 shows a vertical cross section of still another exemplary light source 114. In this example, the light transmitting member 108 includes the deflection member 602. The deflection member 602 is formed from material that can transmit light generated by the semiconductor light emitting device 104, so as to cover the front of the semiconductor light emitting device 104. In the light source according to this example, no other components of the light transmitting member 108 are provided between the semiconductor light emitting device 104 and deflection member 602. For this reason, the light emitted in the forward direction by the semiconductor light emitting device 104 directly reaches the deflection member 602. The deflection member 602 deflects forward light incident from the semiconductor light emitting device 104. The deflection member 602 is preferably positioned in such a manner that the position of the focus of the deflection member 602 coincides with the semiconductor light emitting device 104. Also in this case, it is possible to use the light generated by the semiconductor light emitting device 104 with high efficiency in the light source unit 100 (see FIG. 2). The deflection member 602 may have a similar shape to the deflection member 602 shown in FIG. 9. The deflection member 602 may be provided on the light blocking member 112.

According to this example, the light source 114 can be simply formed by adding the deflection member 602 to a general-purpose light emitting diode module which is not sealed by either a cover or mold. Except for the above, the components shown in FIG. 14 having the same reference numerals as those in FIGS. 3, 8 and 13 have the same or similar functions as/to those of the components in FIGS. 3, 8 and 13 and therefore the description thereof is omitted.

Figure 10:
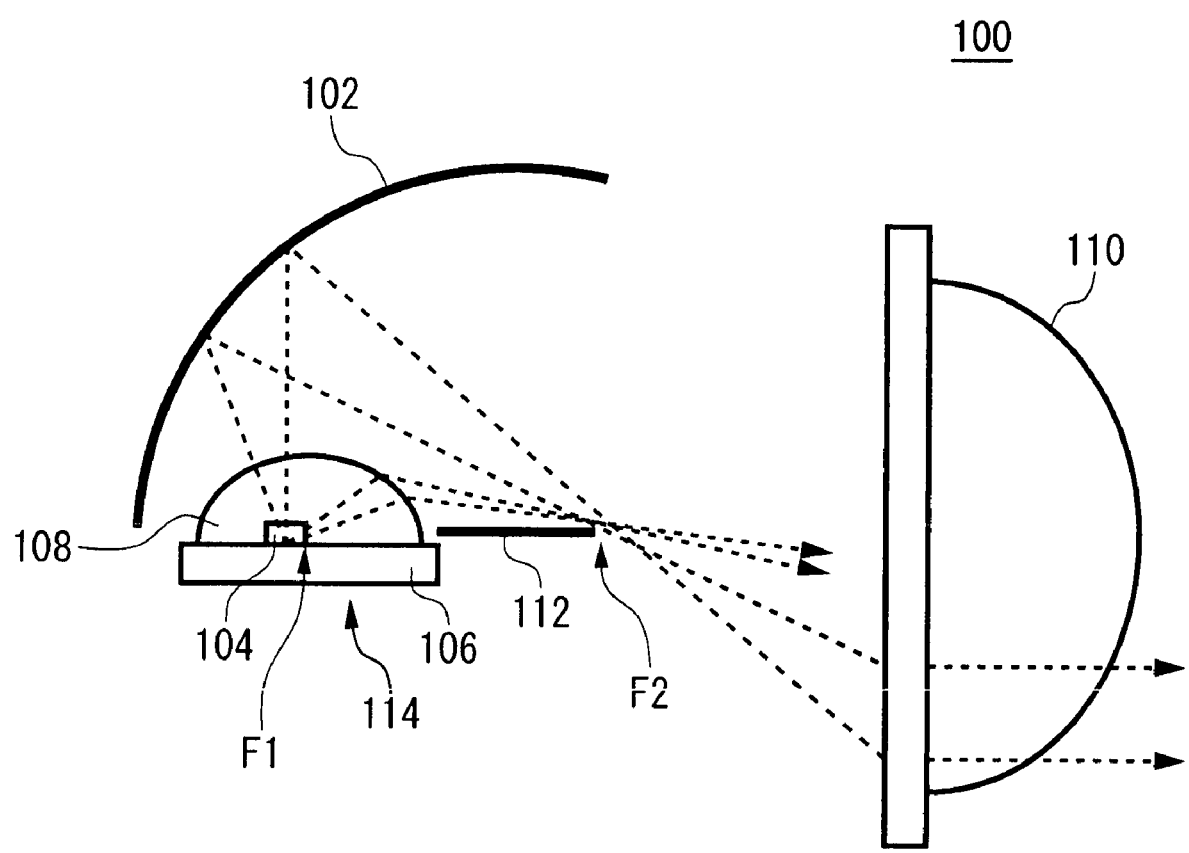
FIG. 10 illustrates another exemplary structure of the light source unit 100.

FIG. 10 shows another exemplary structure of the light source unit 100. In this example, the light transmitting member 108 deflects light generated upward in the forward direction by the light source 114, downward in the forward direction. The light transmitting member 108 preferably makes the deflected light pass in the vicinity of the front edge of the light blocking member 112. In this case, the light transmitting member 108 makes this light incident on a position further closer to the cut line of the light distribution pattern.

Thus, according to this example, it is possible to form the light distribution pattern more appropriately. Except for the above, the components shown in FIG. 10 having the same reference numerals in FIG. 2 have the same or similar functions as/to those in FIG. 2 and the description thereof is omitted.

Figure 11:
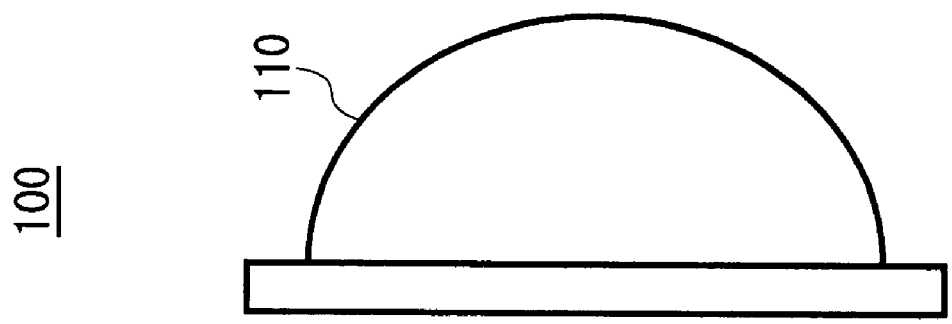
FIG. 11 illustrates still another exemplary structure of the light source unit 100.
Figure 11:
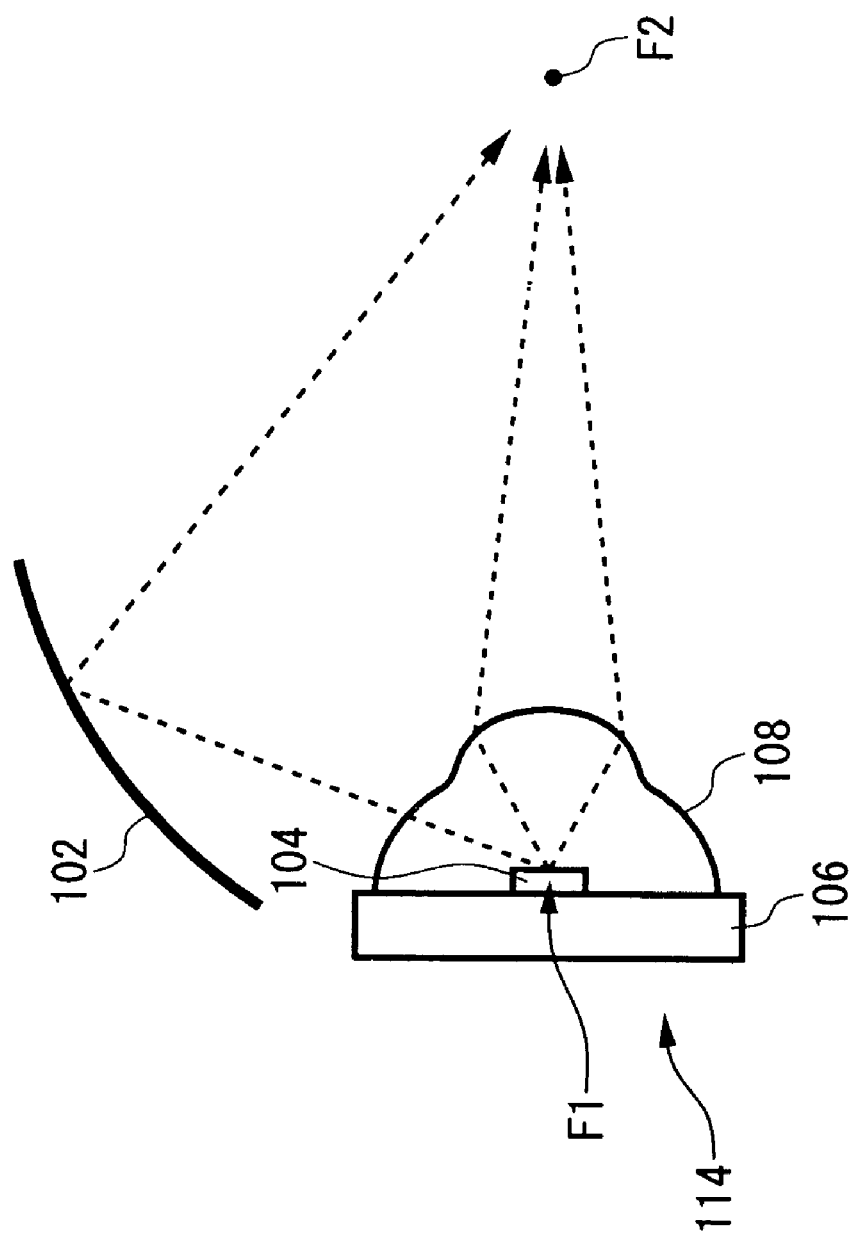

FIG. 11 shows still another example of the light source unit 100. In this example, the light source 114 is provided to face toward the front of the automobile. The light transmitting member 108 has a shape in which a region around an apex of a substantial hemisphere having its center around the semiconductor light emitting device 104 protrudes toward the front of the automobile.

The above protruding region of the light transmitting member 108 deflects forward a part of light generated by the semiconductor light emitting device 104, which is at an angle within a predetermined region with respect to the optical axis of the light source unit 100, so as to converge the part of the light in the vicinity of a predetermined focal point F2, and then makes that part of the light incident on the lens 110. Moreover, a hemispherical region of the light transmitting member 108 other than that protruding region makes the light generated by the semiconductor light emitting device 104 pass straight. At least a part of this hemispherical region makes the light passing therethrough incident on the reflector 102.

In this example, the reflector 102 is formed to cover the light source 114 from above. In an alternative example, the reflector 102 may be formed to further cover the light source 114 from the side and/or beneath. The reflector 102 converges the reflected light in the vicinity of the focal point F2.

The lens 110 directs the light that was incident thereon after being converged at the focal point F2 forward, thereby forming the light distribution pattern. According to this example, it is possible to control light generated by the semiconductor light emitting device 104 with high precision and use it efficiently. Moreover, the light distribution pattern can be formed appropriately based on the light controlled with high precision.

The light source unit 100 further includes a light blocking member (not shown) for forming the cut line, in the vicinity of the focal point F2. In this case, the lens 110 may form the cut line based on the shape of the edge of that light blocking member. Except for the above, the components shown in FIG. 11 having the same reference numerals in FIG. 2 have the same or similar functions as/to those of the components in FIG. 2 and therefore the description thereof is omitted.

Figure 12:
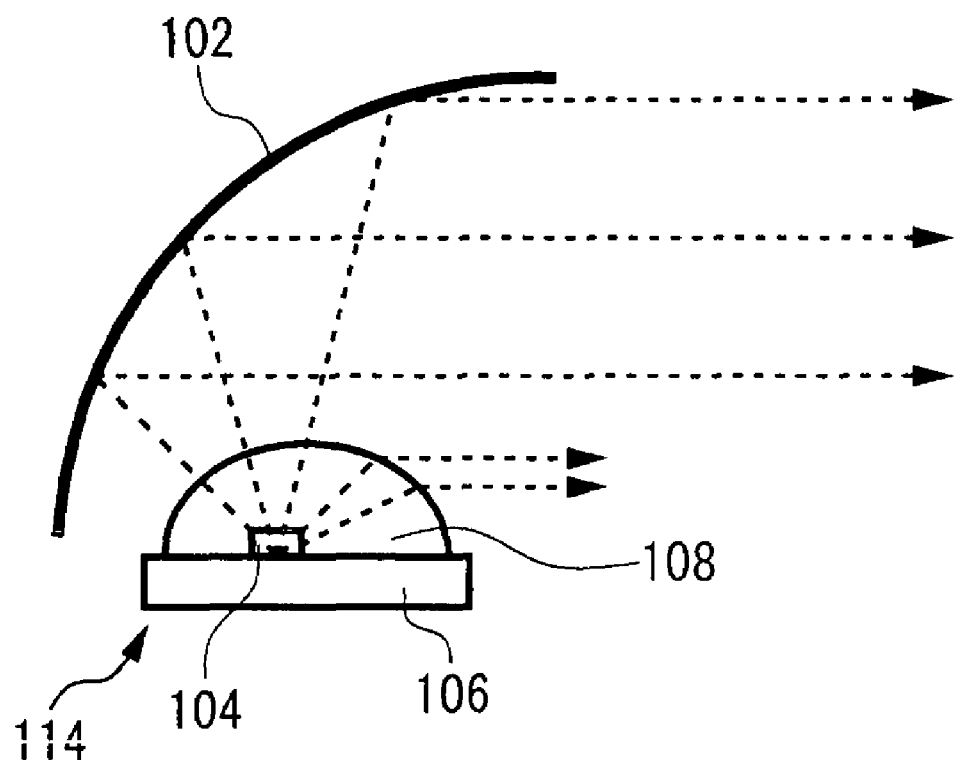
FIG. 12 illustrates still another exemplary structure of the light source unit 100.

FIG. 12 shows still another example of the structure of the light source unit 100. The light source unit 100 of this example is a parabolic light source unit that emits light forward by using a parabolic reflecting face, and includes the reflector 102 and the light source 114. The light source 114 includes the semiconductor light emitting device 104, the substrate 106 and the light transmitting member 108.

In this example, the light transmitting member 108 deflects substantially all of light generated upward in the forward direction by the semiconductor light emitting device 104, toward the substantially horizontal direction. Moreover, the light transmitting member 108 transmits substantially all of light generated upward in the backward direction by the semiconductor light emitting device 104 to pass therethrough straight, for example, thereby transmitting this light toward the reflector 102.

The reflector 102 is a parabolic reflecting mirror having a focal point near the semiconductor light emitting device 104. The reflector 102 reflects the light generated upward in the backward direction by the semiconductor light emitting device 104, toward the substantially horizontal direction. According to this example, it is possible to make substantially all of the light generated by the semiconductor light emitting device 104 go toward the substantially horizontal direction with high efficiency.

The light source unit 100 may make light deflected by the light transmitting member 108 and light reflected by the reflector 102 incident on a region other than the cut line in the light distribution pattern as diffused light, for example. In this case, it is also possible to use the light generated by the semiconductor light emitting device 104 with high efficiency so as to form the light distribution pattern appropriately. Except for the above, the components shown in FIG. 12 having the same reference numerals in FIG. 2 have the same or similar functions as/to those of the components in FIG. 2 and therefore the description thereof is omitted.

While the embodiments of the present invention have been described, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

As is apparent from the above, according to an embodiment of the present invention, it is possible to realize a vehicular headlamp and a light emission module which can use light generated by the semiconductor light emitting device with high efficiency.

What is claimed is:

1. A vehicular headlamp comprising:
   a semiconductor light emitting device that faces in a direction substantially perpendicular to a forward direction;
   a reflector that is formed like a curved surface so as to surround the semiconductor light emitting device, has an opening at the front of the reflector, has an optical center on the semiconductor light emitting device, and reflects forward light generated by the semiconductor light emitting device; and
   a light transmitting member that is formed so as to cover the semiconductor light emitting device, the light transmitting member including:

a cover member that covers the semiconductor light emitting device and transmits at least a part of the light generated by the semiconductor light emitting device; and a deflection member that covers front of the semiconductor light emitting device and deflects forward a part of the light generated by the semiconductor light emitting device, wherein the deflection member is positioned in such a manner that a position of a focus of the deflection member coincides with the semiconductor light emitting device.

2. A vehicular headlamp as claimed in claim 1, wherein the cover member has a shape like a spherical shell having a substantially constant thickness, and having a center around the semiconductor light emitting device.

3. A vehicular headlamp as claimed in claim 1, wherein an inert gas is enclosed in a space between the cover member and the semiconductor light emitting device.

4. A vehicular headlamp as claimed in claim 1, wherein a space between the cover member and the semiconductor light emitting device is substantially a vacuum.

5. A vehicular headlamp comprising:

a semiconductor light emitting device that faces in a direction substantially perpendicular to a forward direction;

a reflector that is formed like a curved surface so as to surround the semiconductor light emitting device, has an opening at the front of the reflector, has an optical center on the semiconductor light emitting device, and reflects forward light generated by the semiconductor light emitting device; and a light transmitting member that is formed so as to cover the semiconductor light emitting device, wherein the light transmitting member includes a deflection member that covers front of the semiconductor light emitting device and deflects forward a part of the light generated by the semiconductor light emitting device, light emitted in a forward direction by the semiconductor light emitting device directly reaches the deflection member, and the deflection member is positioned in such a manner that a position of a focus of the deflection member coincides with the semiconductor light emitting device.

6. A light emission module for generating light used in a vehicular headlamp, comprising:

a semiconductor light emitting device;

a cover member that covers the semiconductor light emitting device, and makes at least a part of light generated by the semiconductor light emitting device transmit therethrough straight; and a deflection member that covers front of the semiconductor light emitting device, and deflects forward a part of the light generated by the semiconductor light emitting device, wherein the deflection member is positioned in such a manner that a position of a focus of the deflection member coincides with the semiconductor light emitting device.

7. A light emission module for generating light used in a vehicular headlamp, comprising:

a semiconductor light emitting device; and a deflection member that covers front of the semiconductor light emitting device, and deflects forward a part of light generated by the semiconductor light emitting device, wherein light emitted in a forward direction by the semiconductor light emitting device directly reaches the deflection member, and the deflection member is positioned in such a manner that a position of a focus of the deflection member coincides with the semiconductor light emitting device.

* * * * *